(12) United States Patent
Karhade et al.

(10) Patent No.: US 11,254,563 B2
(45) Date of Patent: Feb. 22, 2022

(54) MOLD MATERIAL ARCHITECTURE FOR PACKAGE DEVICE STRUCTURES

(71) Applicant: Intel Corporation, Santa Clara, CA (US)

(72) Inventors: Omkar G. Karhade, Chandler, AZ (US); Nitin A. Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 789 days.

(21) Appl. No.: 15/962,912

(22) Filed: Apr. 25, 2018

(65) Prior Publication Data

US 2019/0330051 A1    Oct. 31, 2019

(51) Int. Cl.
*B81B 7/00* (2006.01)
*B81C 1/00* (2006.01)

(52) U.S. Cl.
CPC ........ *B81B 7/0032* (2013.01); *B81C 1/00261* (2013.01)

(58) Field of Classification Search
CPC ....... H01L 2924/186; H01L 2924/0665; H01L 33/56; H01L 2224/32221; H01L 2224/32225; H01L 2224/32245; H01L 23/4334
See application file for complete search history.

(56) References Cited

U.S. PATENT DOCUMENTS

| 9,230,874 | B1 * | 1/2016 | Li | H01L 23/3128 |
| 2002/0132391 | A1 * | 9/2002 | Saia | H01L 24/19 438/118 |
| 2003/0234074 | A1 * | 12/2003 | Bhagwagar | H01L 24/28 156/325 |
| 2013/0241044 | A1 * | 9/2013 | Kim | H01L 23/49816 257/698 |
| 2013/0277816 | A1 * | 10/2013 | Zhang | C08K 3/10 257/676 |
| 2014/0015071 | A1 * | 1/2014 | Shaw | B81C 1/00333 257/416 |

* cited by examiner

*Primary Examiner* — John A Bodnar
(74) *Attorney, Agent, or Firm* — Essential Patents Group, LLP.

(57) ABSTRACT

Embodiments include a microelectronic device package structure having a die on a substrate, where a first side of the die is electrically coupled to the substrate, and a second side of the die is covered with a first material having a first thermal conductivity. A second material is adjacent to a sidewall of the die and adjacent to a sidewall of the first material. The second material has second thermal conductivity, smaller than the first thermal conductivity. The second material may have mechanical and/or underfill properties superior to those of the first material. Together, the two materials may provide a package structure having enhanced thermal and mechanical performance.

17 Claims, 11 Drawing Sheets

MOLD MATERIAL ARCHITECTURE FOR PACKAGE DEVICE STRUCTURES

TECHNICAL FIELD

Embodiments of the present description generally relate to the field of microelectronic packaging, and, more particularly, to microelectronic packages having two different types of mold material.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like. Mobile products, such as cell phones, for example, often have microelectronic packages which include high power devices. Package structures supporting such high-power devices need to possess mechanical and thermal properties that can manage high power device operational requirements.

Mold compounds, which include epoxy containing materials, for example, may be used to encapsulate devices within a microelectronic package. Some mold compounds can exhibit mold flash, where an excess of the molding compound can be formed on edges of devices within the package during mold compound application. Mold flash can negatively affect manufacturing yields, due to visual defects and thermal performance, for example.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
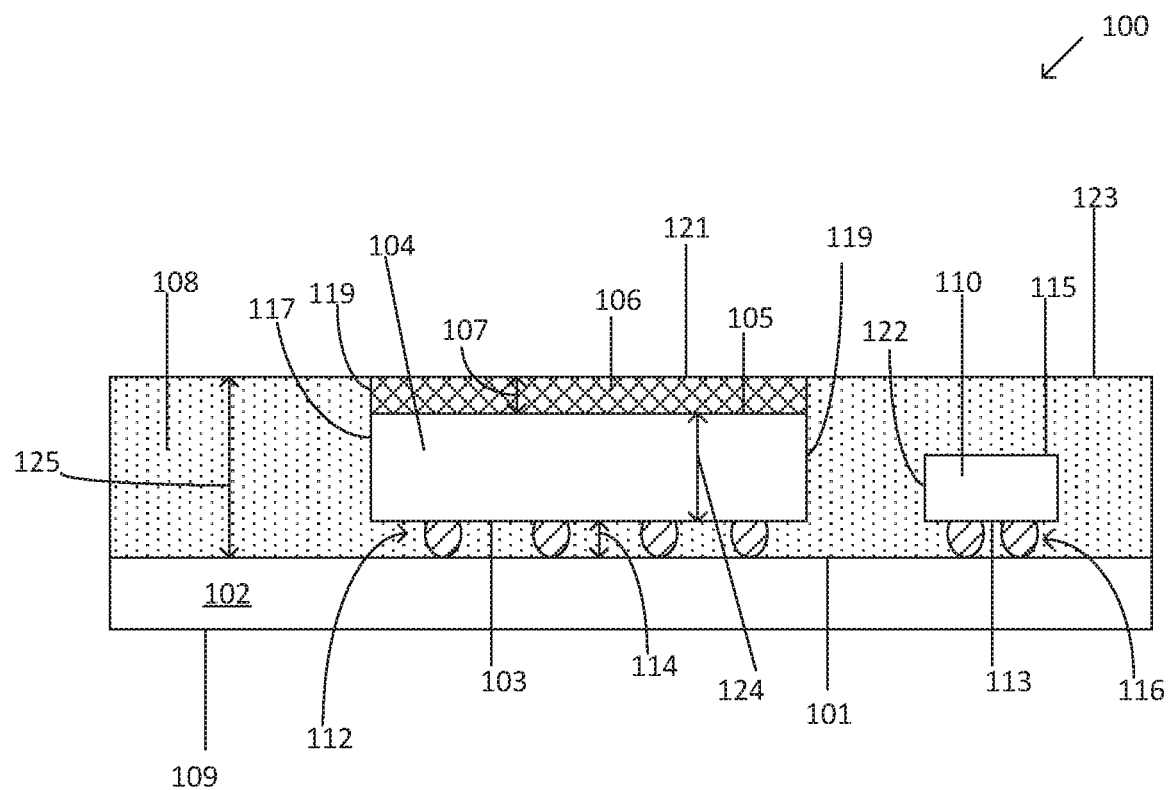
FIG. 1A illustrates a cross-sectional view of a package structure having two mold materials, according to embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "circuit" or "module" may refer to one or more passive and/or active components that are arranged to cooperate with one another to provide a desired function. The term "signal" may refer to at least one current signal, voltage signal, or magnetic signal. The terms "substantially", "close", "approximately", "near", and "about" generally refer to being within +/−10 percent of a target value.

Various implementations of the embodiments herein may be formed or carried out on a substrate, such as a package substrate. In some embodiments, a package substrate may comprise any suitable type of substrate capable of providing electrical communications between an electrical component, such as an integrated circuit (IC) die, and a next-level component to which an IC package may be coupled (such as a circuit board, for example). In other embodiments, the substrate may comprise any suitable type of substrate capable of providing electrical communication between an IC die and an upper IC package coupled with a lower IC/die package, and in some embodiments, a substrate may comprise any suitable type of substrate capable of providing electrical communication between an upper IC package and a next-level component to which an IC package is coupled.

A substrate may also provide structural support for a device, such as a die. By way of example, in some embodiments, a substrate may comprise a multi-layer substrate—including alternating layers of a dielectric material and metal—built-up around a core layer (either a dielectric or a metal core), and may include through via structures that extend through the core. In other embodiments, a substrate may comprise a coreless multi-layer substrate, in which case through via structures may be absent. Other types of substrates and substrate materials may also find use with the disclosed embodiments (e.g., ceramics, sapphire, glass, etc.). Further, according to some embodiments, a substrate may comprise alternating layers of dielectric material and metal that are built-up over a die itself—this process is sometimes referred to as a "bump-less build-up process." Where such an approach is utilized, conductive interconnects may or may not be needed (as the build-up layers may be disposed directly over a die/device, in some cases).

A die may include a front-side and an opposing back-side, and may be an integrated circuit die and/or an integrated circuit device, in some embodiments. In some embodiments, the front-side may be referred to as the "active surface" of the die. A number of interconnects may extend from the die's front-side to an underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some embodiments, a die may be disposed on a substrate in a flip-chip arrangement. In some embodiments, interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be on the terminals of a substrate and/or die, and these terminals may then be joined using a solder reflow process, for example. Of course, it should be understood that many other types of interconnects and materials are possible (e.g., wirebonds extending between a die and a substrate). In some embodiments herein, a die may be coupled with a substrate by a number of interconnects in a flip-chip arrangement. However, in other embodiments, alternative structures and/or methods may be utilized to couple a die with a substrate.

Described herein are microelectronic packaging structures having a first mold material on a top surface of a die, and having a second mold material adjacent a sidewall of the first mold material, and adjacent a sidewall of the die. The first mold material has a first thermal conductivity (K), and the second mold material has a second thermal conductivity, where the first thermal conductivity is greater than the second thermal conductivity. The first mold material on the top surface of the die supports high power device applications, and can enhance high thermal cooling due to the high thermal conductivity properties of the first mold material. The low thermal conductivity mold material may be used between the die and the package substrate, thus avoiding mechanical issues that might occur if instead the first mold material was employed globally within a package structure. Void trapping under discrete components on a package substrate, for example, might be more likely if an underfill was attempted with the first mold material.

Some embodiments include a substrate, where a die, which may be an integrated circuit, is on a first side of the substrate. A first side of the die is electrically coupled to the substrate. A first material is on a second side of the die, opposite the first side of the die. The first material has a first thermal conductivity, where the first thermal conductivity is greater than about 1.0 W/mK, in some embodiments. The first material may be a high thermal conductivity mold material, and may be an epoxy based mold material, for example. As the first material may be employed only within certain locales within a package structure, the composition of the first material may be independently optimized for enhanced thermal performance.

A second material has a second thermal conductivity, where the thermal conductivity is less than about 1.0 W/mK, for example. In some embodiments, the first thermal conductivity of the first material may be at least fifty percent greater than the thermal conductivity of the second material, and in some embodiments, the first thermal conductivity may be at least twice the second thermal conductivity. In some embodiments, the first thermal conductivity may be five times the second thermal conductivity, or may be even greater than five times the second thermal conductivity.

The second material may be a low thermal conductivity mold material, and may be an epoxy mold material, for example. The second material may be adjacent to a sidewall of the die and adjacent to a sidewall of the first material. The second material may be employed within a package structure anywhere the first material is less suitable.

Being less constrained by thermal concerns, the composition of the second material may be independently optimized for enhanced mechanical performance. Together, the first and second materials may combine synergistically for a package having thermal and mechanical performance that far exceeds that which may be achieved with any single package material.

FIG. 1A is a cross-sectional view of a package structure 100, arranged in accordance with some embodiments of the present disclosure. The package structure 100 includes a die 104 electrically and physically coupled to a first side 103 of a portion of a substrate 102. The substrate 102 may comprise a portion of a system in package substrate, a printed circuit board, or any other suitable substrate according to a particular application. The substrate 102 may include such materials as phenolic cotton paper (e.g., FR-1), cotton paper and epoxy materials (e.g., FR-3), woven glass materials that are laminated together using an epoxy resin (e.g., FR-4), glass/paper with epoxy resin (e.g., CEM-1), glass composite with epoxy resin, woven glass cloth with polytetrafluoroethylene (e.g., PTFE CCL), or other polytetrafluoroethylene based prepreg material.

The substrate 102 may include conductive interconnect structures/routing layers (not shown) that are within dielectric layer(s), which may be configured to route electrical signals between any number of die 104 and the substrate 102, in some embodiments. For example, interconnect structures may include routing structures such as pads or traces configured to receive electrical signals to and from devices. In some embodiments, individual ones of the conductive interconnect structures/routing layers comprise trenches, ground planes, power planes, re-distribution layers (RDLs), and/or any other appropriate electrical routing features. The dielectric layers and the conductive layers/structures within and on the dielectric layers of the substrate 102 are sometimes referred to as a "package substrate." The substrate 102 may also provide structural support for discrete component 110 and/or any other type of device electrically coupled to the substrate 102.

Various types of substrates and substrate materials may find use with the disclosed embodiments (e.g., ceramics, sapphire, glass, etc.). The substrate 102 may be any substrate known to be suitable for one or more of flip-chip packages (FCBGA), package-on-package (PoP), system-in-package (SiP), or the like. The substrate 102 may further include interconnect structures (not shown) such as solder balls, on a second side 109, opposite the first side 101 of the substrate 102, which may couple the package structure 100 to a motherboard, or any other suitable type of board, for example.

The substrate 102 may include any number of die 104 electrically coupled to the first side 103, opposite the second side 109 of the substrate 102. The die 104 may be an integrated circuit, or any other type of suitable die. In some embodiments, the die 104 may be any type of die which consumes a large amount of power, such as a die requiring more 1 Watt to operate (such as a system on a chip) for example. Such die may generate a significant amount of heat, and may require sufficient cooling to maintain an acceptable operating environment, in order to avoid adversely affecting the operations of the die 104, and possibly neighboring die/components that may be adjacent the die 104 on the substrate 102.

The die 104 may be any type of integrated device or integrated component that may be included within an electronic device package. In some embodiments, the die 104 includes a processing system (either single core or multi-core). In some embodiments, the die 104 may be a microprocessor, a graphics processor, a signal processor, a network processor, a chipset, a memory device etc. In some embodiments, the die 104 be a system-on-chip (SoC) having multiple functional units (e.g., one or more processing units, one or more graphics units, one or more communications units, one or more signal processing units, one or more security units, etc.).

In some embodiments, the die 104 may be attached to the substrate 102 according to a variety of suitable configurations including a flip chip configuration, or any other suitable attachment configuration. In the flip chip configuration, a first side 103 of the die 104 may be an active side of the die 104, and may be attached to a first side of the substrate 102, using interconnect features 112, which may comprise such conductive features as bumps or pillars, which serve to route electrical signals, such as I/O, power and/or ground signals, associated with the operation of the die 104. In some embodiments, the wire bonding or the flip chip connections may comprise conductive materials such as copper, gold and nickel.

In an embodiment, a first material 106, is on/over a second side 105 of the die 104. In some embodiments, the first material 106 has a first thermal conductivity that is greater than about 1.0 W/mK. In some embodiments, the first material 106 comprises a mold compound, such as an epoxy containing mold compound, however in other embodiments, the first material 106 may comprise any suitable compound with which to provide cooling and mechanical support for the die 104. In some embodiments, the first material 106 may be a thermally conductive epoxy material which may include a filler.

In some examples, the filler is in a particulate form. In some embodiments, the filler particles of the first material 106 may include such materials as silica or aluminum oxide particles, for example. The first material 106 may include any suitable type of filler materials, where the filler materials may have a particular composition, and/or a particular diameter (range), that enhances thermal conductivity. In some embodiments, the filler particles may have a concentration of between about 45-80 percent by volume, and may have a diameter of about 1 micron to about 100 microns, for example. In some embodiments, the first material 106 may have a thickness 107 of between about 50 microns to about 200 microns.

In an embodiment, the package structure 100 includes a second material 108. The second material 108 may advantageously have a second thermal conductivity that is less than about 1.0 W/mK. In some embodiments, the second material 108 is a mold compound, such as an epoxy containing mold compound, however in other embodiments, the second material 108 may be any suitable compound with which to provide mechanical support for the die 104. In some embodiments, the second material 108 may be an epoxy material with a filler, where the filler may be in the form of a plurality of particles.

In some embodiments, the second material 108 may have particles, that include such materials as silica or aluminum oxide particles, for example, although any suitable composition of particle may be included. The second material 108 may include any suitable type of filler materials, where the filler materials may have a particular composition, occupy a particular volume in the material, and/or have a particular diameter (range) that enhances mechanical properties, underfill properties, etc. In some embodiments, the particles may comprise a concentration of between about 45-80 percent by volume, and may comprise a particle diameter of below about 20 microns, for example. The second material 108 may have any thickness, for example sufficient to be adjacent with a sidewall of the first material 106.

In an embodiment, the second material 108 may comprise a thickness 125 that may be substantially equal to a combined thickness/height of a standoff height 114 of the die 104 (the standoff height 114 comprising the distance between the first side 101 of the substrate 102 and the first side 103 of the die 104), a thickness of the die 124, and a thickness 107 of the first material 106. In an embodiment, a top surface 121 of the first material 106 and a top surface 123 of the second material 108 are substantially coplanar. In some embodiments, a sidewall 119 of the first material 106 may be directly adjacent the second material 108. In some embodiments, a sidewall 117 of the die 104 may be in alignment with a sidewall 119 of the first material 106.

In an embodiment, a plurality of interconnect features 112, which may comprise solder materials such as, but not limited to, one or more of gold, lead, tin, nickel, or silver, for example, electrically and physically couple the first side 103 of the die 104 with the first side 101 of the substrate 102. The second material 108 is on an around the plurality of interconnect features 112, in an embodiment. The first material 106 is not on the first side 101 of the substrate 102, and is not around the plurality of interconnect features 112, in an embodiment. In an embodiment, the first material 106 is only on the second side 105 of the die 104.

In an embodiment, one or more discrete components 110 are coupled to the first side 101 of the substrate 102, adjacent the die 104. The discrete component 110 may be a surface mount component 110, in some embodiments. The discrete component may be a resistor, inductor, capacitor or a discrete transistor, in some embodiments. The discrete component 110 may be a power device, in some embodiments, such as a discrete power transistor, for example. The discrete component 110 may include resistor materials, such as, but not limited to, carbon, silicon, oxides of silicon, metals and oxides of metals, in some embodiments. The discrete component 110 may include inductive materials, such as, but not limited to, ferromagnetic materials, conductive materials, such as copper for example, and dielectric materials, such as silicon dioxide, in some embodiments. The discrete component 110 may include a dielectric material, and may be a portion of a capacitor, in some embodiments. In other embodiments, the discrete component 110 may be a portion of a discrete transistor, such as a discrete bipolar or a discrete field effect transistor (FET), and may include conductive materials, silicon, and oxides of silicon.

A first side 113 of the discrete component 110 may be electrically and physically coupled to the first side 101 of the substrate 102 by a plurality of interconnect features 116. The plurality of interconnect features 116 may include one or more conductive materials, such as, but not limited to, solder materials such as lead, tin or solder, copper, gold or nickel, in some embodiments. In an embodiment, the first material 106 is not on the plurality of discrete component 110 interconnect features 116, or on the discrete component 110. Instead, the second material 108 is on both the first side 113 and the second side 115 of the discrete component 110. The second material 108 is also on the plurality of interconnect features 116. The plurality of discrete component 110 interconnect features 116 may include one or more conductive materials, such as, but not limited to, solder materials such as lead, tin or solder, copper, gold or nickel, in some embodiments.

Figure 1B:
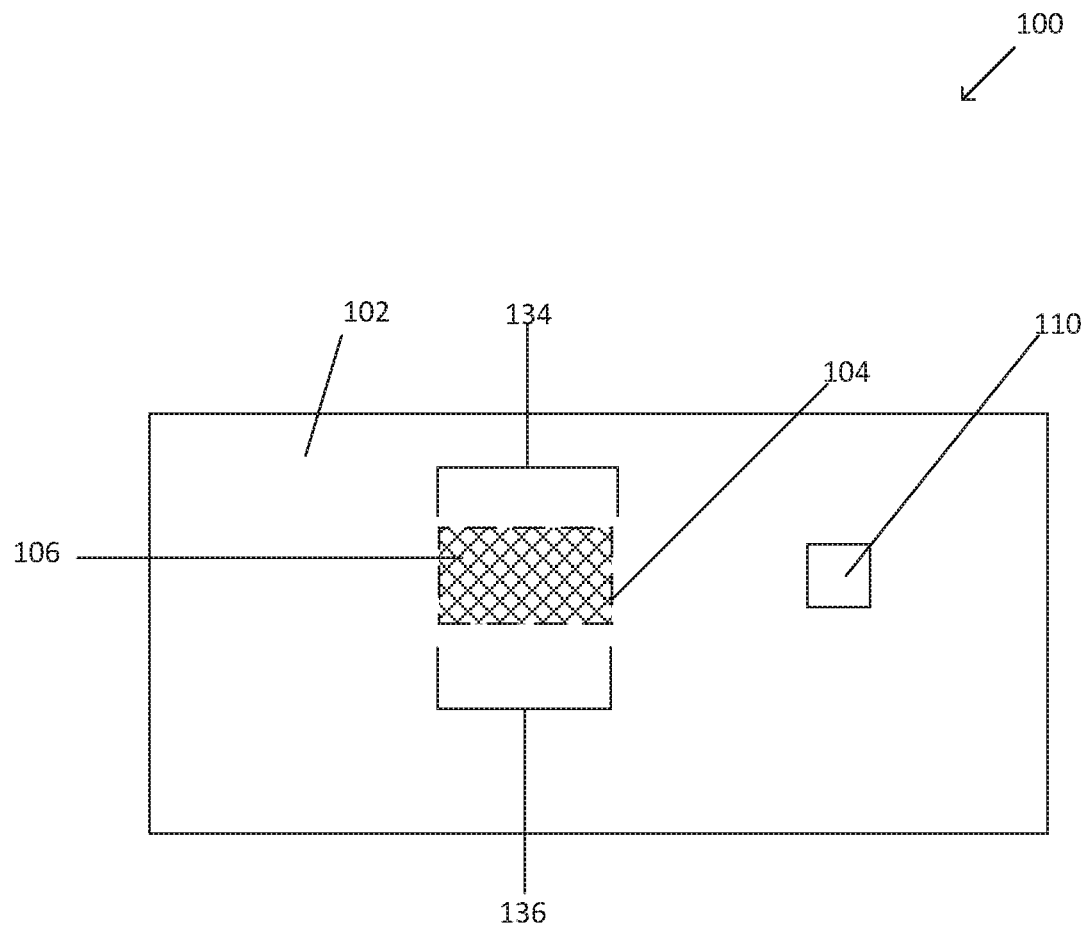
FIG. 1B illustrates a top view of a package structure having two mold materials, according to embodiments.
Figure 1C:
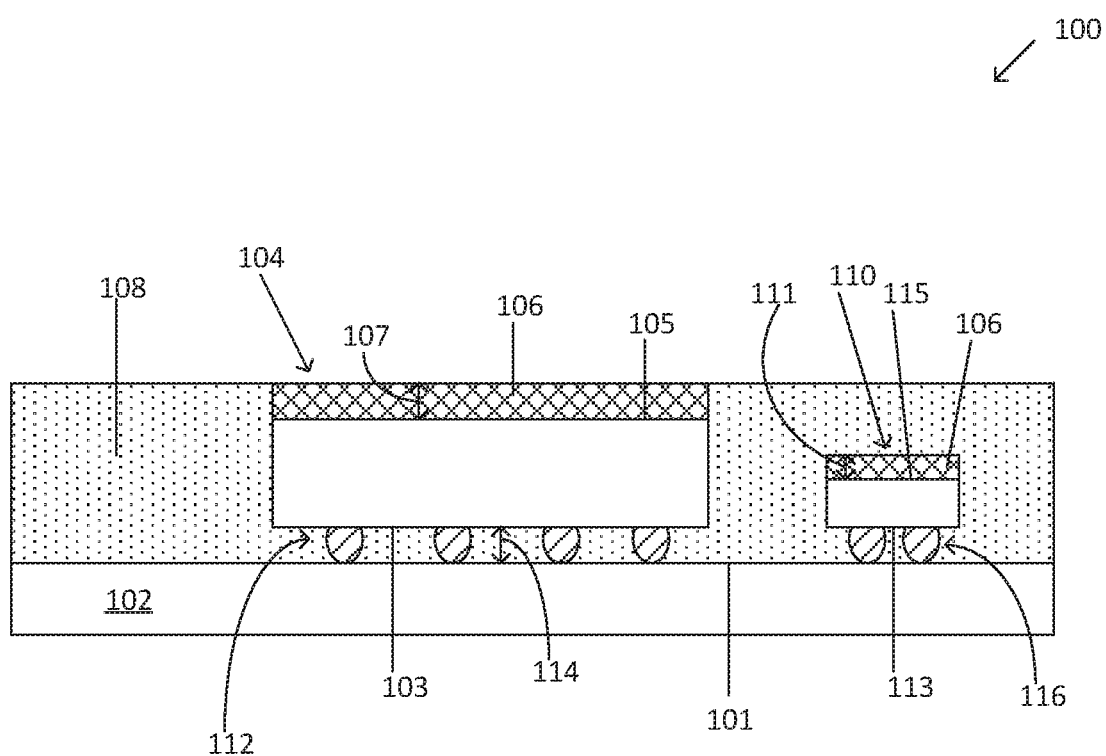
FIG. 1C illustrates a cross-sectional view of a package structure having two mold materials, according to embodiments.

FIG. 1B depicts a top view of the package structure 100, where a die 104 is adjacent a discrete component 110 on a substrate 102. An area 134 of the first material 106 is substantially the same as an area 136 of the die 104, in some embodiments. FIG. 1C depicts a cross-sectional view of an embodiment where the first material 106 is on both the second side 105 of the die 104, and on the second side 115 of the discrete component 110. The first material 106 on the second side 115 of the discrete component 110 may have a thickness 111 of between about 50 microns to about 200 microns, in some embodiments. In some embodiments, the first material 106 may be on any number of discrete components or die that are on the substrate 102, including where the first material 106 is on surfaces of stacked die configurations, for example.

Figure 1D:
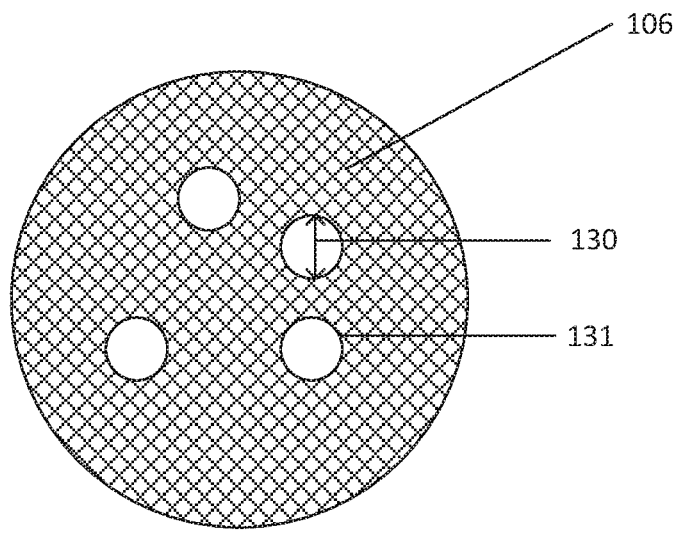
FIGS. 1D-1E illustrate top views of two mold materials, according to embodiments.
Figure 1E:
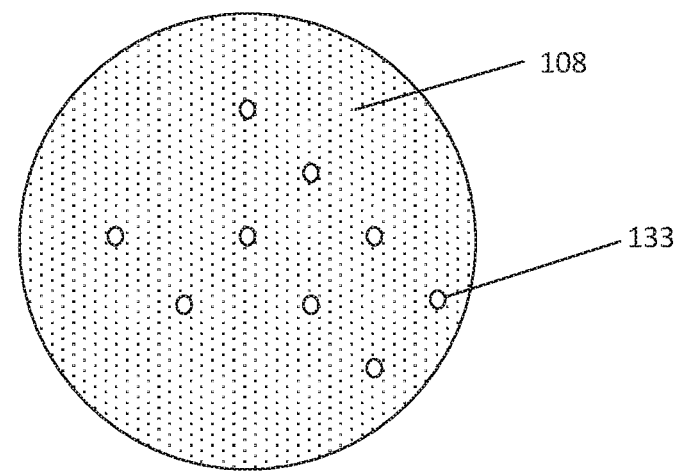

FIG. 1D depicts a top view of a portion of the first material 106. The first material 106 may include a plurality of particles 131. Individual ones of the plurality of particles 131 may have a diameter 130, where the diameter 130 may be between about 25 microns to about 100 microns, in some embodiments. A larger particle size, and/or a greater particle volume may enhance thermal properties of the second material 108. FIG. 1E depicts a top view of a portion of the second material 108. The second material 108 may include a plurality of particles 133. The individual ones of the plurality of particles 133 may have a smaller diameter than diameter 130 associated with particles 131. A smaller particle size, and/or a smaller particle volume may improve mechanical and/or underfill properties of the second material 108. The individual ones of the plurality of particles 133 may have a diameter, where the diameter may be below about 20 microns, in some embodiments, and may be between about 1 micron to about 20 microns, in some embodiments.

Figure 2:
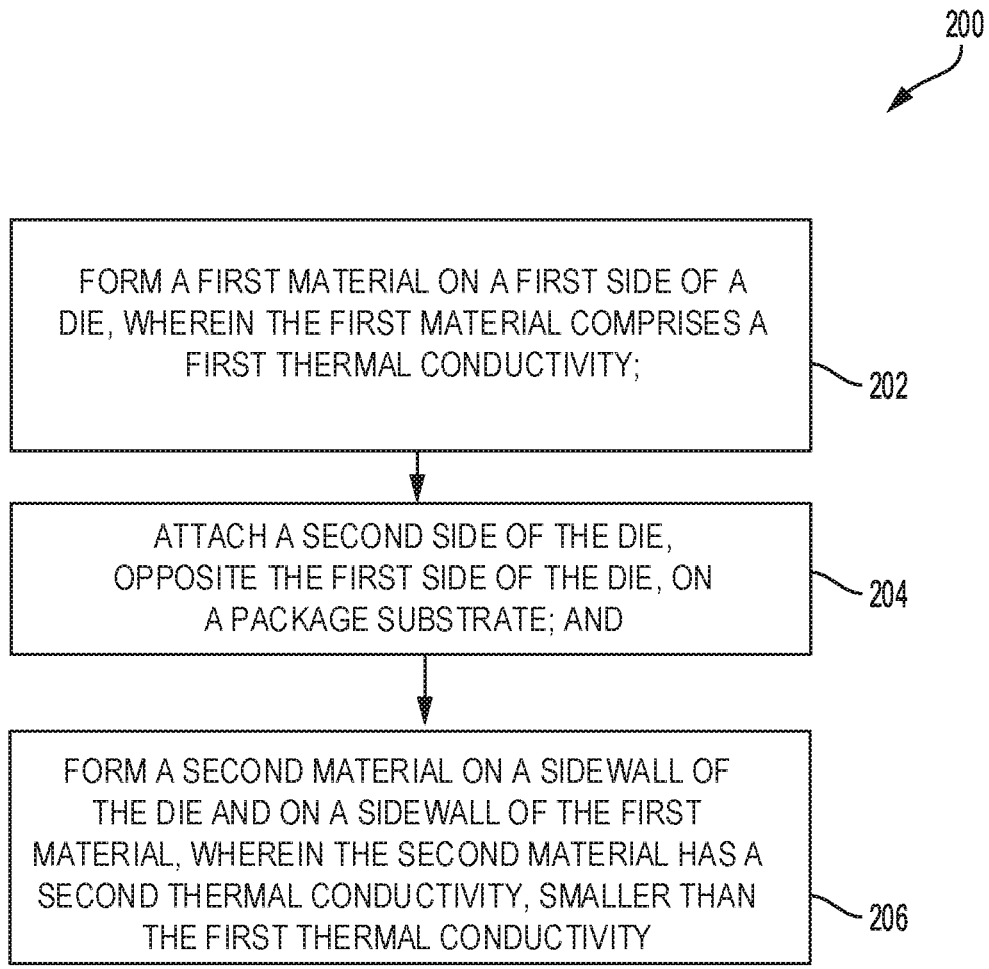
FIG. 2 is a flow diagram illustrating a method of fabricating package structures with two mold materials, according to embodiments.

FIG. 2 depicts a flow chart of an embodiment of a method 200 of forming two mold materials within a package device structure, where a die on a package substrate has a first mold material on a top surface of the die. A second mold material is on the sidewalls of the die and on the sidewalls of the first mold material, and is between a plurality of interconnect features and the die. The second material is additionally between a discrete component and the substrate. The method 200 may share any or all characteristics with any other methods discussed herein, such as, but not limited to, the methods disclosed in FIGS. 3A-3F. For example, FIGS. 3A-3F may show cross-sectional views of structures employing any of the operations described in method 200. It should be noted that the order of the operations of method 200 may be varied, according to a particular application.

At operation 202, a first material is formed on a first side of a die, which is a non-active side of the die, in some embodiments. The plurality of die may include any type of die, such as a processor die, or a memory die, for example. In some embodiments, the first material may be formed on a wafer, which may include a plurality of dies, or may be formed on a panel structure, which may comprise a plurality of dies. Individual die of the plurality of die may have a plurality of interconnect features, such as a plurality of solder balls, on the second side of the die, which may be an active side of the die, in some embodiments. The plurality of interconnect features may comprise metal, such as copper, aluminum or gold, for example, and may be in the shape of pillars or lands, in some cases. The plurality of interconnect features may be conductive bumps, such as C4 bumps or balls, or wire structures, in some embodiments. The plurality of interconnect features may be formed in any variety of manners, such as, but not limited to plating processes, printing and reflow processes or wire bonding, for example.

In some embodiments, the panel or wafer of dies may be thinned from their original die thickness, prior to the formation of the first material on the non-active side of the dies, by using a grinding process, or a chemical and/or a mechanical process, such as a chemical mechanical polishing process, for example. The wafer or panel comprising the die may be thinned to reduce the thickness of a resulting package, while still maintaining structural integrity of the die.

The first material may be an epoxy containing compound, such as an epoxy molding compound (EMC), and may include a polymer, a polymer composite material, such as an epoxy resin with a filler, an epoxy acrylate with a filler, or a polymer with a filler, for example. The first material may serve to mechanically protect the die, and may provide cooling for high power die, and optionally other components on the substrate, that may be attached adjacent to the die. The first material may protect the die from heat, shock, moisture, and other environmental hazards. In some embodiments, the fillers of the first material may include silica, aluminum, or oxides of silica or aluminum, where the fillers may be in particulate form. The particles of the first material may comprise diameters of between about 25 microns to about 100 microns, in some embodiments. The first material may have a first thermal conductivity, such as above 1.0 W/mK, in some embodiments. The first material may have a first thermal conductivity between about 2.0 W/mk to about 5.0 W/mK, in some exemplary embodiments.

The first material may be formed on the dies by using any suitable molding process, such as a high thermal conductivity molding process, for example. The first material may be formed on the top surface of the die, but not on sidewalls or bottom surfaces of the die. The first material may undergo a curing process after formation on the back side of the die, in some embodiments. The wafer or panel may then be singulated to form individual die. The individual die may be singulated while the first material is on the backside of the die, by using a shear, a saw, or other cutting device.

At operation 204, a second side of the singulated, individual die, which may comprise an active side of the die, may be attached to a substrate, such as a package substrate. The plurality of interconnect features, such as solder balls for example, may be attached to interconnect features on the surface of the substrate, in any variety of manners. For example, the plurality of interconnect features may be attached by utilizing a solder reflow process, where the interconnect features may be reflowed utilizing mass reflow, or thermal compression bonding, in some embodiments.

The plurality of interconnect features may be mated with and may be chemically and/or physically bonded with conductive pads that may be on a surface of the substrate, in some embodiments. Additional components, such as discrete power components, for example, may be attached onto the substrate, adjacent the die, where the components comprise a plurality of interconnect features that may be electrically and physically coupled to the substrate utilizing any suitable connection processes, such as those utilized for attachment of the plurality of interconnect features associated with the singulated die.

At operation 206, the second material may be formed over the die and adjacent components that have been attached onto the substrate. The second material is additionally formed on the die sidewall, as well as on a sidewall of the first material. The second material is also formed on the plurality of solder interconnect features that couple the die and adjacent components onto the substrate. An expose die molding process may be employed, which may include a molded underfill process. The second material may comprise an epoxy containing mold compound, such as an epoxy molding compound (EMC), and may comprise a polymer, a polymer composite material, such as an epoxy resin with a filler, an epoxy acrylate with a filler, or a polymer with a filler, for example. The second material may serve to protect die and any adjacent components from heat, shock, moisture, and other environmental hazards. The second material may possess suitable mechanical properties to protect the assembled package from warpage, which could adversely affect assembled package integrity and fabrication yield.

The fillers of the second material may include silica, aluminum, or oxides of silica or aluminum. The fillers may be in particulate form. The particles of the second material may comprise diameters of between about 4 microns to about 20 microns, in some embodiments. The second material may have a second thermal conductivity, which may be below about 1.0 W/mK, in some embodiments. The second material may have a second thermal conductivity between about 0.10 W/mk to about 1.0 W/mK, in some exemplary embodiments.

The second material may be formed on all exposed surfaces of the die and adjacent components, including sidewalls, and on the plurality of interconnect features, and may be formed on the top surface of the first material. The second material may optionally undergo a curing process after formation, in some embodiments. In some embodiments, the second material may undergo a planarization process, where a top surface of the second material may be thinned so that the top surface of the first material and a top surface of the second material may be substantially coplanar. The planarization process may include any suitable mechanical, chemical, and/or grinding process.

By forming the low thermal conductivity second material on the high thermal conductivity first material, little to no mold flash occurs, since the mold materials are compatible with each other, thus reducing yield loss due to mold flash. In some embodiments, a form factor of the assembled package can be reduced, since capillary underfill is not required. Voiding issues between interconnect features and the substrate are eliminated as well, since the high thermal conductivity first material is restricted to formation on the top surface of die, and optionally on top surfaces of adjacent components, and is not present between the plurality of interconnect features and the substrate. Thus, embodiments included herein enable high thermal cooling of power devices within a packaged device, while minimizing yield loss due to mold flash.

Figure 3A:
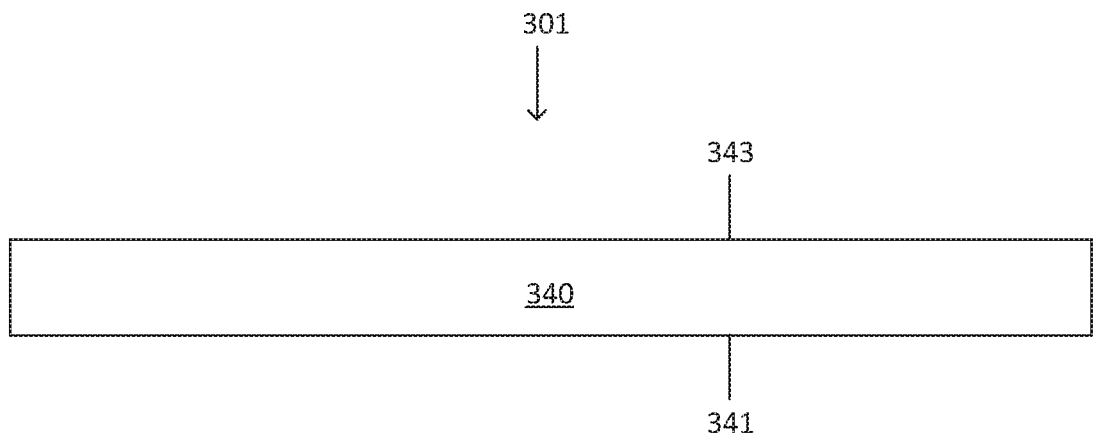
FIGS. 3A-3F illustrate cross-sectional views of package structures formed according to methods of fabricating package structures with two mold materials, according to embodiments.

FIGS. 3A-3F depict cross-sectional views of structures formed by employing a process of fabricating package device structures comprising two mold compounds, where the two mold compounds comprise two different thermal conductivities. In FIG. 3A, a portion of a wafer 340 is depicted. The wafer 340 may comprise a plurality of die, such as, but not limited to, a plurality of integrated circuit die, and may comprise various types of materials, such as conductive, dielectric and semiconductor materials. Each individual die may include any number of circuit elements, such as any type of transistor elements and/or passive elements. The individual die may comprise n-type and/or p-type transistors, which may include materials such as silicon, germanium, indium, antimonide, lead telluride, indium arsenide, indium phosphide, gallium arsenide, or gallium antimonide, for example. The individual die may include such structures as planar transistors and/or nonplanar transistors, such as FinFET transistors, nanowire transistors or nanoribbon transistors.

The wafer 340 may comprise a first side 341 and a second side 343. Active surfaces of the individual die may be on the first side 341 of the wafer 340, wherein conductive contacts of various integrated circuit devices, such as transistor devices, for example, may be available for connection to a package substrate, for example.

The backside surfaces of the plurality of die may be on the second side 343 of the wafer 340, where the backsides of the die may comprise a silicon material, for example. In some embodiments, the second side 343 of the wafer 340 may undergo a thinning process 301, in some embodiments, by using a grinding or polishing process, for example, in order to reduce a thickness of the individual die of the wafer 340. In some embodiments, the structure 340 may comprise a panel structure, wherein the panel structure comprises a plurality of die.

Figure 3B:
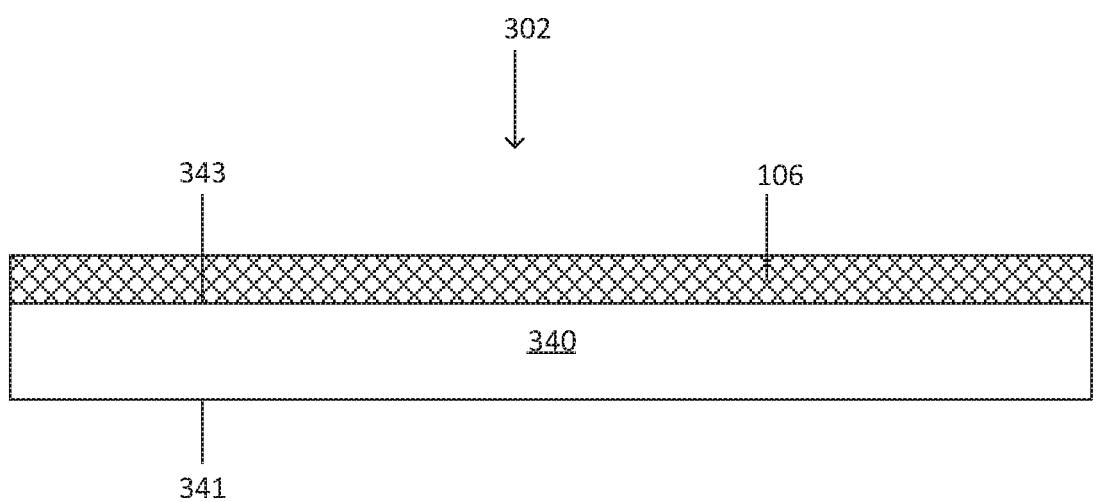

In FIG. 3B, a first material 106 may be formed on the second side of the wafer 340, and may be formed over the backsides of the individual die of the wafer 340. The first material 106 may comprise a high thermal conductivity mold compound, where the thermal conductivity may be between about 1.0 W/mK to about 5 W/mK, in some embodiments. The first material 106 may be formed using any suitable mold formation process 302. In some embodiments, the first material 106 may comprise a thickness of between about 50 microns to about 200 microns, but the thickness of the first material 106 may vary according to particular design requirements.

Figure 3C:
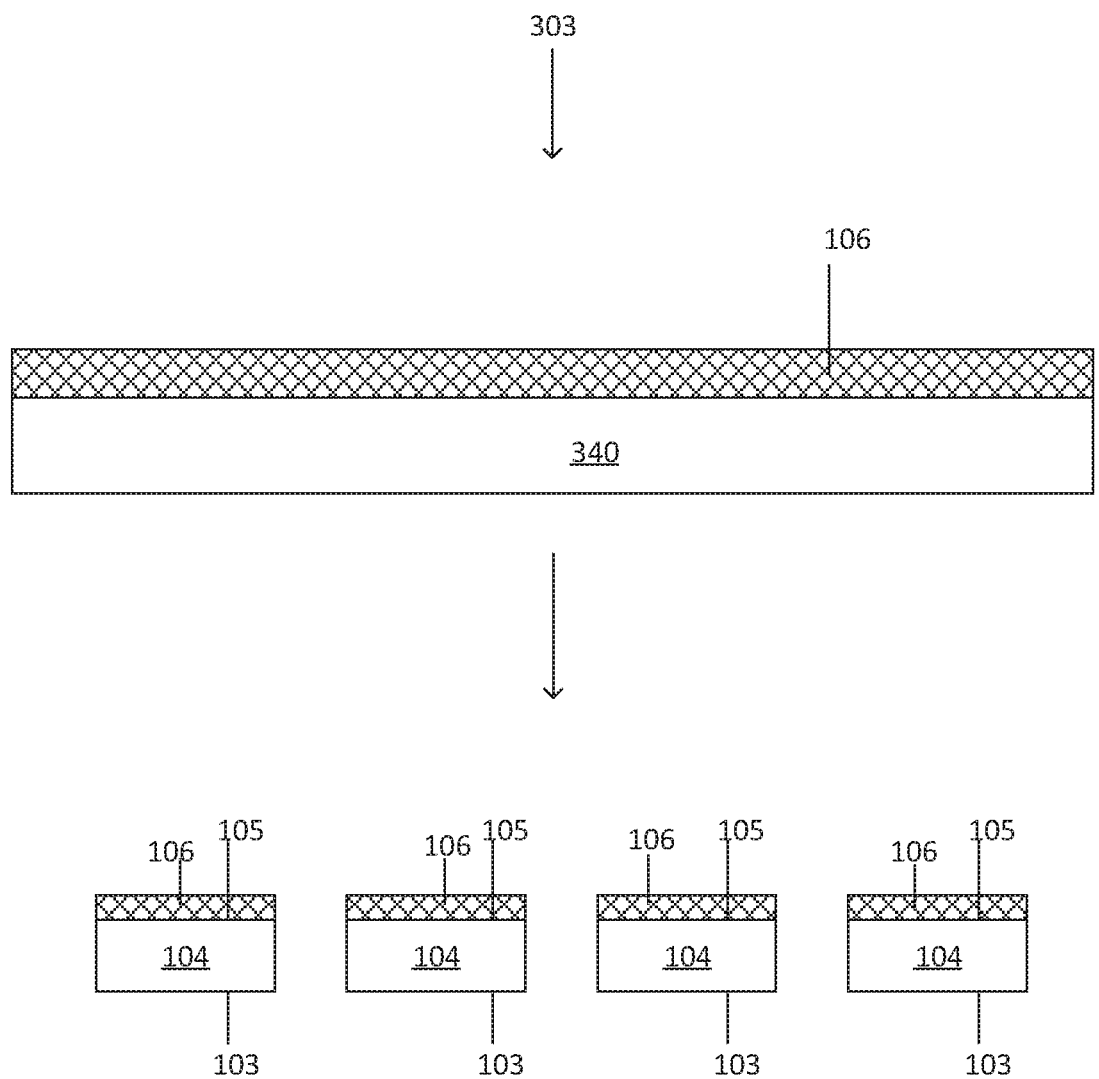

In FIG. 3C, a singulation process 303 may be performed on the wafer 340. The plurality of die within the wafer 340 may be separated from one another into discrete die 104. The wafer 340 may be singulated through the first material 106. The individual die 104 may have a first side 103 and a second side 105, where the first material 106 is on the second side 105 of the die.

Figure 3D:
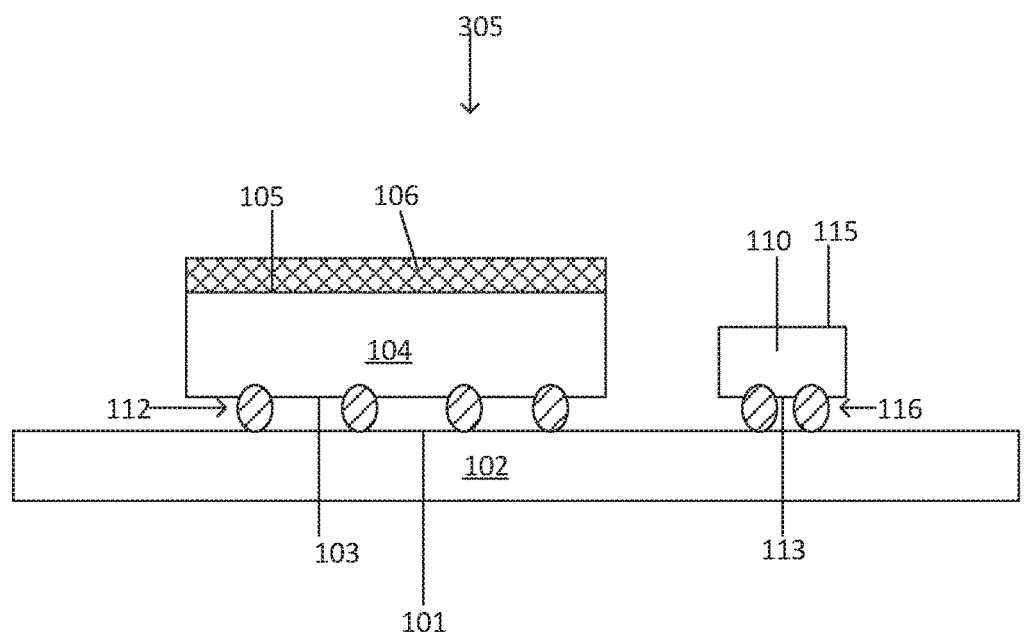

In FIG. 3D, an attachment process 305 may be performed, where one or more individual die 104 comprising the high thermal conductivity first material 106 on the second side 105 of the die 104, may be attached to a substrate 102, such as a package substrate 102. In some embodiments, the molding process 305 may comprise a thermal compression bonding process 305. Any number of additional components, such as discrete components 110, for example, may be attached, adjacent the die 104, onto the substrate 102. The attachment process 305 may comprise any suitable attachment process, where a plurality of interconnect features 112 on the first side 103 of the die, and a plurality of interconnect features 116 on the first side 113 of the discrete component 110, may be joined to interconnect features/pads (not shown) that are on a surface of the substrate 102. In an embodiment, the first material 106 may be on a second side 115 of the discrete component (not shown).

Figure 3E:
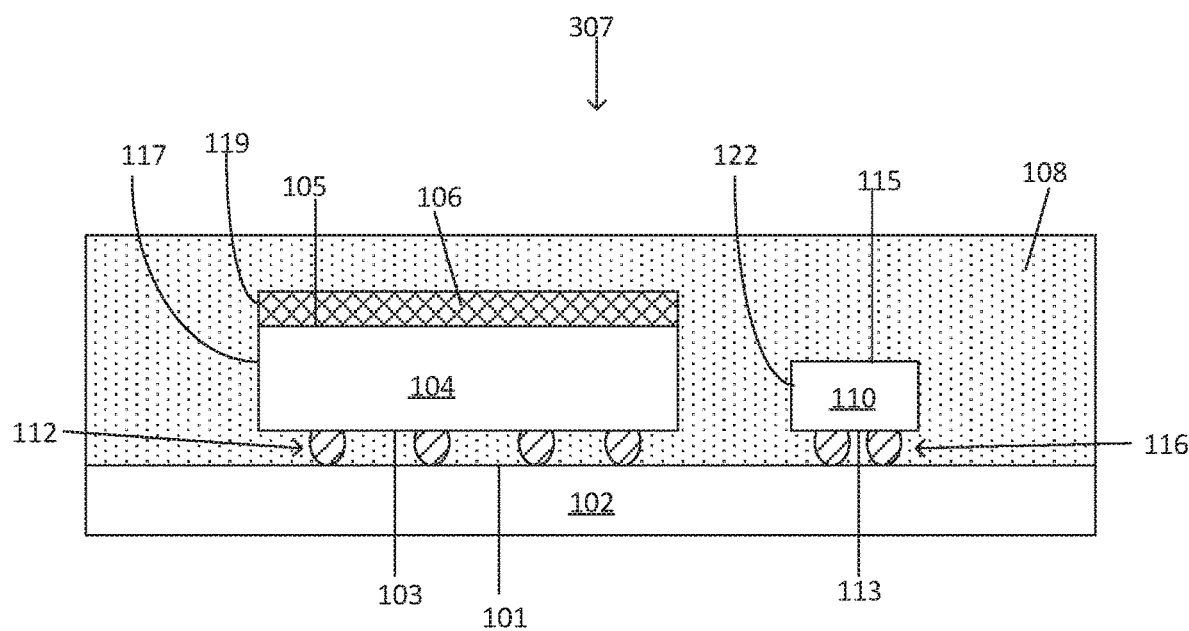

FIG. 3E depicts a second material 108 that is formed over the die 104 and over the discrete component 110. The second material 108 is a low thermal conductivity mold compound, in an embodiment. The second material 108 may be formed using any suitable mold formation process 307, such as an exposed die molding process. In some embodiments, a molded underfill process is included in the mold formation process 307. In an embodiment, the second material 108 is formed on sidewalls 117 of the die 104, on sidewalls 119 of the first material 106, and on sidewalls 122 of the discrete component 110. In an embodiment, the second material 108 surrounds the die interconnect features 112 and the discrete component 110 interconnect features 116, and is between the first sides 103, 113 of the die 104 and the discrete component 110 respectively, and the substrate 102. The second material 108 is on the substrate surface 101, and is on the second side of the discrete component 110, in some embodiments.

Figure 3F:
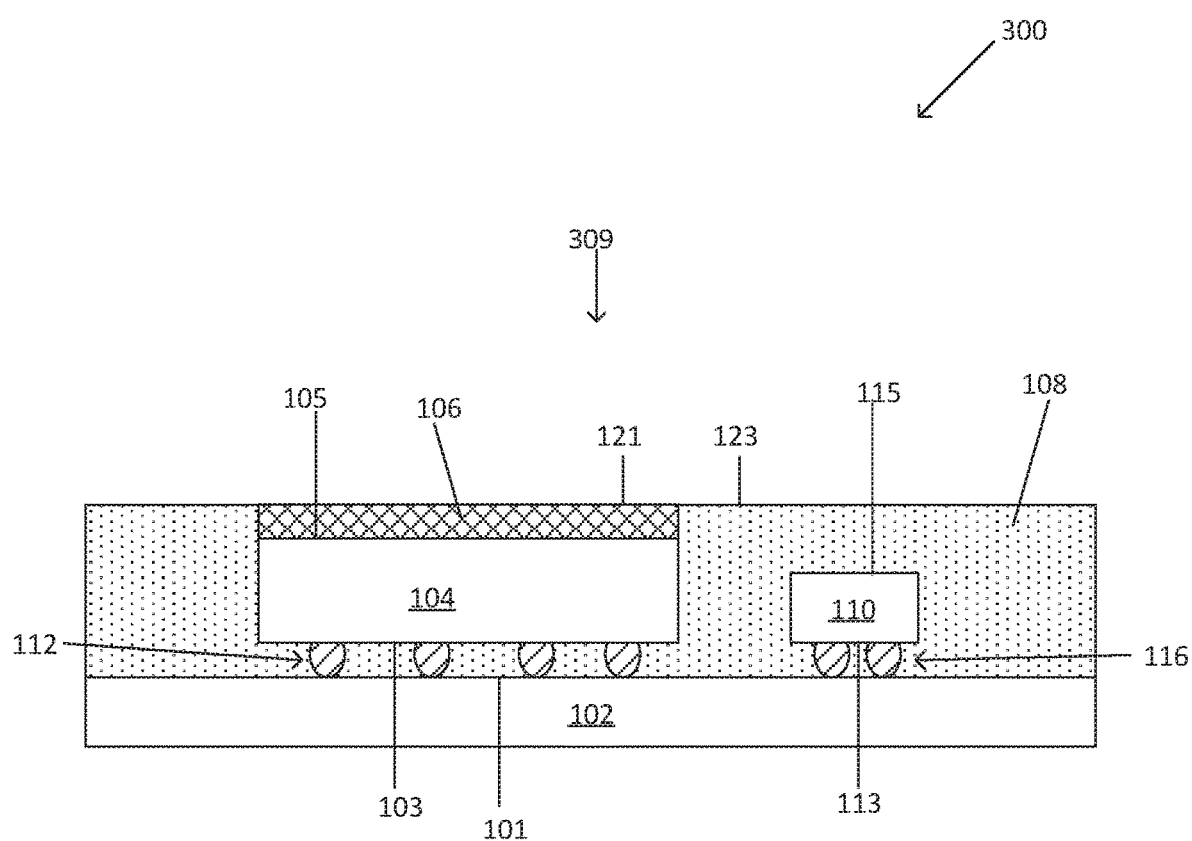

FIG. 3F depicts the package structure 300 subsequent to a planarization process 309, where a top surface 121 of the first material 106 and a top surface 123 of the second material 108 are planarized by a chemical and or a mechanical process, such as a chemical mechanical polish process, for example. In some embodiments, an exposed die molding process may be employed, where the top of the die may be covered by a polymer film, which prevents mold material from being formed over the die, thus alleviating the need for employing the planarizing process 309. The top surfaces 121, 123 of the first and second materials 106, 108 are substantially coplanar with respect to each other. The package structure 300 may comprise a package device structure, which may be subsequently attached to a board, such as a motherboard, for example.

Figure 4:
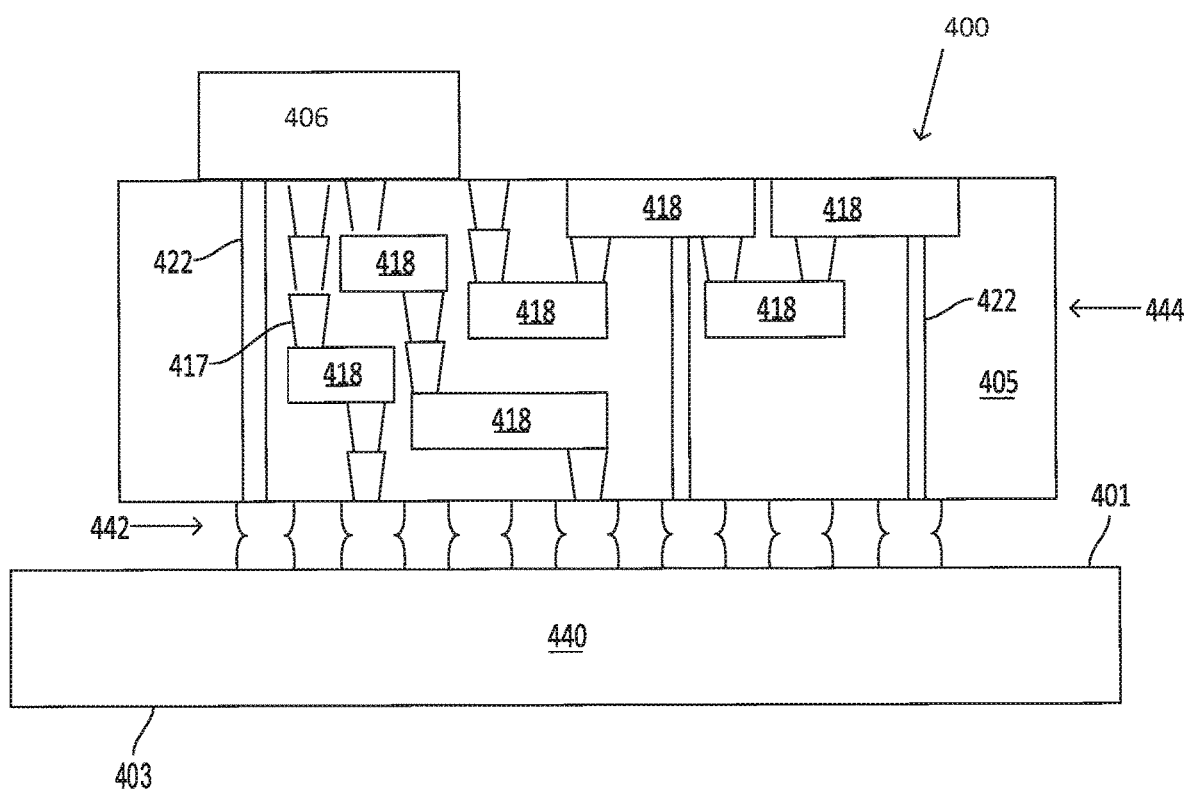
FIG. 4 is a cross-sectional view of a computing system employing packaging structures having two mold materials, in accordance with embodiments.

Turning now to FIG. 4, illustrated is a cross sectional view of a computing system 400, that may include any of the package structures described herein, such as the package structure 100 of FIG. 1A, for example, which includes two mold materials. The system 400 includes a board 440, such as a motherboard, or any other suitable type of circuit board. Board 440 includes a first side 401 and an opposing second side 403, where various components may be on either one or both of the first and second sides 401, 403 of the board, and may include components such as any type of power discrete components, for example.

In some embodiments, the computing system 400 includes one or more package structures 406 on a surface of a substrate 444, where the substrate 444 may comprise an interposer, for example. The package structure 406 may comprise any number of integrated circuit die, where top surfaces of the die may have a high thermal conductivity mold material thereon, and a low thermal conductivity adjacent a sidewall of the high thermal conductivity mold material, as in the package structure 100 of FIG. 1A. The package device 406 may comprise any type of integrated die or integrated component that may be included within an electronic device package. In some embodiments, die included in the package structure 406 may include a processing system (either single core or multi-core), a microprocessor, a graphics processor, a signal processor, a network processor, a chipset, a memory device etc. In some embodiments, the die/device 406 comprises a system-on-chip (SoC) having multiple functional units. Joint structures 442 may electrically and physically couple the substrate 444 to the board 440.

In some embodiments, the substrate 444 may be any suitable type of circuit board or other substrate capable of providing electrical communication between one or more of the various components disposed on the substrate 444. In one embodiment, for example, the substrate 444 is a printed circuit board (PCB) comprising multiple metal layers 418 separated from one another by dielectric material 405, and interconnected by electrically conductive vias 417. The substrate 444 may further comprise through vias 422 with which to route signals between the components on the surface of the substrate 444 and the board 440. Any one of the metal layers 418 may be formed in a desired circuit pattern to route—perhaps in conjunction with other metal layers—electrical signals between the device package 406 and the substrate 444. However, it should be understood that the disclosed embodiments are not limited to the above-described PCB and, further, that the substrate 444 may be any other suitable substrate. In some embodiments, the routing layers, including vias 422 and 417 may comprise conductive materials such as copper, gold and nickel.

System 400 may be any type of computing system, such as, for example, a hand-held or mobile computing device (e.g., a cell phone, a smart phone, a mobile internet device, a music player, a tablet computer, a laptop computer, a net top computer, etc.). However, the disclosed embodiments are not limited to hand-held and other mobile computing devices and these embodiments may find application in other types of computing systems, such as desktop computers and servers.

Figure 5:
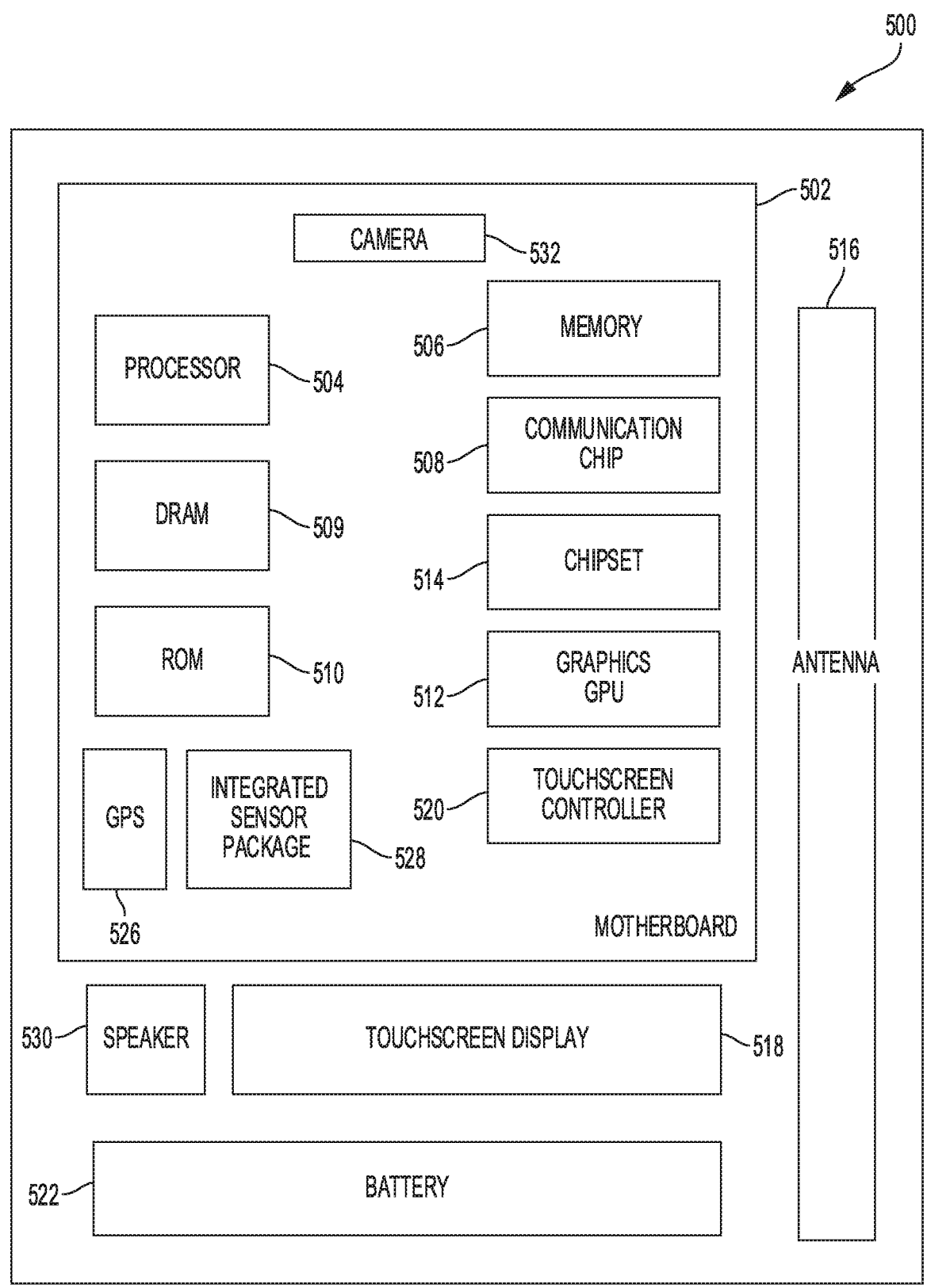
FIG. 5 is a functional block diagram of employing packaging structures having two mold materials, in accordance with embodiments.

FIG. 5 is a schematic of a computing device 500 that may be implemented incorporating the package structures described in any of the embodiments herein comprising discrete components with ball interconnect structures on a substrate, such as those depicted in FIG. 1A, for example. In an embodiment, the computing device 500 houses a board 502, such as a motherboard 502 for example. The board 502 may include a number of components, including but not limited to a processor 504, an on-die memory 506, and at least one communication chip 508. The processor 504 may be physically and electrically coupled to the board 502. In some implementations the at least one communication chip 508 may be physically and electrically coupled to the board 502. In further implementations, the communication chip 508 is part of the processor 504.

Depending on its applications, computing device 500 may include other components that may or may not be physically and electrically coupled to the board 502, and may or may not be communicatively coupled to each other. These other components include, but are not limited to, volatile memory (e.g., DRAM) 509, non-volatile memory (e.g., ROM) 510, flash memory (not shown), a graphics processor unit (GPU) 512, a chipset 514, an antenna 516, a display 518 such as a touchscreen display, a touchscreen controller 520, a battery 522, an audio codec (not shown), a video codec (not shown), a global positioning system (GPS) device 526, an integrated sensor 528, a speaker 530, a camera 532, an amplifier (not shown), compact disk (CD) (not shown), digital versatile disk (DVD) (not shown), and so forth). These components may be connected to the system board 502, mounted to the system board, or combined with any of the other components.

The communication chip 508 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments herein are not limited to the embodiments so described, but can be practiced with modification and alteration without departing from the scope of the appended claims.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should, therefore, be determined with reference to the appended claims, along with the full scope of equivalents to which such claims are entitled.

The invention claimed is:

1. A microelectronic device package structure comprising:
   a substrate;
   a die comprising an integrated circuit, wherein a first side of the die is electrically coupled to the substrate;
   a first material over a second side of the die, opposite the first side, wherein the first material has a first thermal conductivity, and wherein the first material comprises particles comprising a diameter of between 25 microns and 100 microns; and
   a second material adjacent to a sidewall of the die and adjacent to a sidewall of the first material, wherein the second material has a second thermal conductivity, smaller than the first thermal conductivity.

2. The microelectronic device package structure of claim 1, wherein the second material is between a plurality of interconnect features that couple the first side of the die to the substrate, and wherein the second material is in contact with the die and the substrate.

3. The microelectronic device package structure of claim 2, wherein a thickness of the second material is substantially equal to a combined thickness of the first material, a thickness of the die, and a standoff height associated with the plurality of interconnect features.

4. The microelectronic device package structure of claim 1, further comprising a discrete component adjacent to the die, wherein:
- a first side of the discrete component is electrically coupled to the substrate;
- the second material is between the sidewall of the die and a sidewall of the discrete component; and
- the second material is over a second side of the discreet component, opposite the first side of the discrete component.

5. The microelectronic package structure of claim 3, wherein a top surface of the first material is substantially planar with a top surface of the second material.

6. The microelectronic package structure of claim 1, an area of the first material is substantially equal to an area of the first side of the die, and the sidewall of the first material is in alignment with the sidewall of the die.

7. The microelectronic package structure of claim 1, wherein the first material comprises a high K mold material, and wherein the high K mold material has a thermal conductivity of between 1.0 W/mK and 5 W/mK.

8. The microelectronic package structure of claim 7, wherein the high K mold material comprises an epoxy compound.

9. The microelectronic package structure of claim 1, wherein the second material comprises a low K mold material, wherein the low K mold material has a thermal conductivity of less than 1.0 W/mK.

10. The microelectronic package structure of claim 9, wherein the low K mold material comprises an epoxy material and filler particles, wherein the filler particles comprise a diameter of less than about 20 microns.

11. The microelectronic package structure of claim 1, wherein the particles comprises a plurality of filler particles and wherein the first material comprises a thickness between 50 microns to 200 microns.

12. An assembly comprising:
- a board;
- a microelectronic device package electrically coupled to the board, the microelectronic device package comprising:
  - a substrate;
  - a die comprising an integrated circuit, wherein a first side of the die is electrically coupled to the substrate;
  - a first material over a second side of the die, opposite the first side, wherein the first material has a first thermal conductivity, and wherein the first material comprises particles comprising a diameter of between 25 microns and 100 microns;
  - a second material adjacent to a sidewall of the die and adjacent to a sidewall of the first material, wherein the second material has a second thermal conductivity, smaller than the first thermal conductivity; and
- a memory device on the board, wherein the memory device is electrically coupled to the die.

13. The assembly of claim 12, wherein the substrate further comprises one or more discrete components adjacent the die, wherein a first side of individual ones of the discrete component is on the substrate, and wherein the second material is on a second side of individual ones of the discrete component, wherein the second side of the discrete component is opposite the first side of the discrete component.

14. The assembly of claim 12, wherein the microelectronic device package comprises a processor.

15. The assembly of claim 12, wherein a plurality of solder interconnect features is between the first side of the die and the substrate, and wherein the first material is not on the plurality of solder interconnect features.

16. The assembly of claim 12, wherein the first material comprises a thickness of between 50 microns to 200 microns, and comprises and epoxy material.

17. The assembly of claim 12, wherein individual ones of the particles comprise one or more of silicon or aluminum.

* * * * *